United States Patent
Angelopoulos et al.

(10) Patent No.: US 6,221,568 B1
(45) Date of Patent: Apr. 24, 2001

(54) DEVELOPERS FOR POLYCHLOROACRYLATE AND POLYCHLOROMETHACRYLATE BASED RESISTS

(75) Inventors: Marie Angelopoulos, Cortlandt; Wayne Martin Moreau, Wappingers Falls; Karen Elizabeth Petrillo, Mahopac, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/421,591

(22) Filed: Oct. 20, 1999

(51) Int. Cl.[7] .................................................... G03F 7/32
(52) U.S. Cl. ................................... 430/331; 430/311
(58) Field of Search .................................... 430/331, 311

(56) References Cited

U.S. PATENT DOCUMENTS

| | | | |
|---|---|---|---|
| 4,476,217 | * | 10/1984 | Douglas et al. ............... 430/326 |
| 4,740,451 | * | 4/1988 | Kohara ............................ 430/325 |
| 5,290,664 | * | 3/1994 | Matsumoto .................... 430/296 |
| 5,403,699 | * | 4/1995 | Takechi et al. ................. 430/296 |
| 5,747,218 | * | 5/1998 | Momota et al. ................ 430/192 |
| 5,876,897 | * | 3/1999 | Durham et al. ................ 430/170 |
| 5,945,258 | * | 8/1999 | Shimizu et al. ................ 430/314 |
| 5,962,183 | * | 10/1999 | Rahman et al. .............. 430/270.1 |
| 6,103,443 | * | 8/2000 | Wanat et al. ................... 430/191 |

* cited by examiner

Primary Examiner—Hoa Van Le
(74) Attorney, Agent, or Firm—Daniel P. Morris

(57) ABSTRACT

The present invention is directed to developer compositions for poly-alpha-acrylate or methacrylate based resists giving high contrast and whose components are closely matched in boiling points. The use of the present developer improved the critical dimensional uniformity of images developed in a positive electron beam resist. More particularly, the present invention is directed to developer formulations whose compositions are directed to enhanced printed linearity, better across the plate uniformity, and improved contrast of the imaged positive resists. Such a improved developer can be used for the positive resist exposed by photons, electrons, ions, or X-rays.

32 Claims, 7 Drawing Sheets

Diethyl ketone/Diethyl malonate
Gamma 1.8

Diethyl ketone/Diethyl malonate
Gamma 1.8

75:25 Diethyl ketone:Diethyl malonate
25KeV Exposure Tool

- Diethyl ketone:Diethyl malonate
- Diethyl ketone:Propylene glycol methyl ether acetate 60:40 Diethyl ketone:Propylene glycol methyl ether acetate 24% anisole/76% 4-heptanone ■ 13% Anisole/87% 4-heptanone Gamma = 2.1
● 24% Anisole/76% 4-heptanone Gamma = 1.9

DEVELOPERS FOR POLYCHLOROACRYLATE AND POLYCHLOROMETHACRYLATE BASED RESISTS

FIELD OF INVENTION

The present invention is directed to improved developer compositions in particular for polychloroacrylate and polychloromethacrylate based resists.

BACKGROUND

The production of binary masks consists of pattern definition by exposure of electron beam resists on a chrome coated glass plate. The image is then developed and the pattern is etched into chrome by either aqueous based wet etching or by reactive ion etching with a chlorine bases plasma, most typically $Cl_2/O_2$. (C. Sauer, SPIE Proceed., U.S. Pat. No. 3,236,413 (1997), the teaching of which is incorporated herein by reference.

With the advent of shrinking dimensions, the photomask of nX enlargement (n=4–10X) is also shrinking to less than 400 nm in dimensions. Because wet etching causes undercutting or undesired enlargement, reactive ion etching (RIE) has been utilized (W. Tsai, etal, SPIE Proceed., U.S. Pat. No. 3,412,149 (1998), the teaching of which is incorporated herein by reference). In RIE, >50% of the resist film can be eroded away. The particular resists that have been used for electron beam exposure are polymers that undergo main chain degradation. The primary examples are derived from a positive resist such as polymethylmethacrylate (PMMA) described in U.S. Pat. No. 3,535,137 and polybutene sulfone described in U.S. Pat. No. 3,935,332, the teachings of both of which are incorporated herein by reference. Improved contrast developers for PMMA can be found such as amyl acetate such as described in U.S. Pat. No. 3,931,435 and in U.S. Pat. No. 4,078,098, the teachings of both of which are incorporated herein by reference, for a mixture of methyl isobutyl ketone and water. All of these resists and copolymers are described in W. Moreau, SEMICONDUCTOR LITHOGRAPHY, Plenum Press, 1989, Chapter 3, the teachings of which are incorporated herein by reference. All of these resists however are not dry etch resist and thus the pattern can not be transferred by an RIE process.

For reactive ion etching a commercial resist called ZEP manufactured by Nippon Zeon (T. Coleman, SPIE Proceed., U.S. Pat. No. 3,236,397 (1997), the teachings of which has been incorporated herein by reference) has been used. The ZEP is composed of a copolymer of alpha-chloromethacrylate and alpha-methyl styrene (PCMMS). Copolymers of polyalpha-chloromethacrylate are described in U.S. Pat. Nos. 4,359,481; 4,011,351; 4,454,222, the teachings of which is incorporated herein by reference. A preferred example is described in U.S. Pat. No. 4,259,407, the teachings which is incorporated herein by reference, which is directed to a copolymer of poly(alpha-chloroacrylate-alpha-methylstyrene) which is now sold commercially by NIPPON ZEON as ZEP 7000 electron beam resist. In U.S. Pat. No. 4,259,407, a developer is claimed of a ketone such as 3 pentanone mixed with another ketone. In U.S. Pat. No. 4,454,222 a developer described which is MIBK (4 methyl-2 butanone) and isoproponal or a mixture with 2 butanone is used for a trifluoromethyl alpha-chloroacylate-methacrylic acid copolymer in a spray develop mode. In U.S. Pat. No. 4,414,313, the teachings of which is incorporated herein by reference, a mixture of dimethylacetamide and toluene is used as developer for a poly(alpha-chloroacrylate-methacrylic acid copolymer. All of these developers use flammable solvent components or solvent partners which differ widely in evaporative rates. The large difference in volatility causes changes in the ratio of solvent/non-solvent particularly in spray development mode which is widely practiced for chrome plate development. The change in solvent composition results in poor development and poor linewidth control across the mask plate. Poor linewidth control across the plate control is characteristic of the developers which are offered with ZEP resists.

The ZEP resist uses a commercial developer preferably consisting of the following compositions: ZED 300-Methyl ethyl ketone/anisole 93/7 by wt; ZED 400-Diglyme/Methyl ethyl ketone 20/80 by wt; and ZED 500-Diethyl ketone/Diethyl malonate 50/50 by wt. All of these compositions suffer from rapid evaporative loss of the more volatile ketone developer (which has a lower boiling point than the other components of the developer) and provide non-uniform development across the electron-beam written mask Also, with these developers very low contrast is attained. The best is 1.8 obtained from the diethyl ketone:diethyl malonate developer. The contrast of a resist is obtained from the slope of a plot of the percent of developed film remaining vs Log of the dose as described in Moreau (SEMICONDUCTOR LITHOGRAPHY, page 30).

High contrast electron beam resists are needed for chrome mask fabrication. Because of electron beam back scattering from the substrate, closely spaced images suffer from adjacent exposure and is known as the proximity effect. In order to correct for this effect, a scheme known as the GHOST correction has been popularized by G. Owen, J. Vac. Sci. and Tech. B9, 1888 (1990), the teaching of which is incorporated herein by reference. In this procedure, a second flood exposure of 40% of the dose to print is used after the initial line dose to normalize the background exposure of the proximity effect. The resist is then developed and the closely spaced line features are printed to size. In order for a resist to be an effective reactive ion etch mask, not more than 15% of film loss of the initially unexposed region at 40% GHOST dose should be developed away. For example, in a 3500 A thick resist, more than 2500 A resist remaining (<28% loss) is necessary to protect the chrome mask during reactive ion etching. A typical ZEP 7000 contrast curve is shown in FIG. 1. When the GHOST correction is applied 67% (33% loss) of the initial 3500 A resist film (2345 A) of the film will remain which is not adequate masking for reactive ion etching of chrome.

The present ZED developers are inadequate for GHOST correction since >30% of flood exposed film is lost at 40% background dose. What is needed are improved developers to result in a higher contrast resist (>2.0,) which in turn would result in greater film retention when the GHOST correction is applied.

A popular method of development is spray of the solvent onto the surface of the chrome plate. The spray process involves volatization of the developer in progressing from a liquid to a vapor. During this process, the less volatile liquid is dominant in the condensing liquid and the composition of the developer becomes richer in the higher boiling (lower vapor pressure) constituent. Since the ZEP developers utilize volatile and flammable solvent/non-solvent blends, the need for combustible and uniform composition developers is desired especially for spray development mode. The boiling point of solvents or non-solvents that can be utilized are as follows. Solvents which boil above 145 C. are generally combustible in nature and more desirable from a safety viewpoint. There is a need for improved developers for ZEP and other chloroacrylate based resists which result in high contrast and whose components are closely matched in boiling point.

In addition to using ZEP type resists for chrome mask fabrication, other masks, substrates, or direct exposure of silicon wafers could also be exposed and developed with the resist, exposure tools, and developer modes used in semiconductor fabrication.

OBJECTS

It is an object of the present invention to provide improved developers for resists, in particular chloroacrylate and chloromethacrylate based resists, which enhance the contrast of the resist without altering the dose of energy required to form a developable pattern in the resist.

It is another object of the present invention to provide improved developers for resists, in particular chloroacrylate and chloromethacrylate based resists, whose components are closely matched in boiling point.

Another object of the present invention is the improved fabrication of chrome binary or phase shift masks using in particular positive type resists.

Another object of the present invention is uniform development of the exposed substrate especially utilizing spray development.

SUMMARY OF THE INVENTION

A broad aspect of this invention is the selection of the components of a developer which provide high contrast at the lowest dose for a resist, in particular for a positive resist.

Another aspect is a developer whose components are selected to be closely matched in boiling point Another aspect of the present invention is the utilization of the improved developer composition in a spray mode of development with good linewidth control across the mask plate.

BRIEF DESCRIPTION OF THE DRAWINGS

These and other objects, features and advantages of the present invention will become apparent upon a consideration of the following detailed description and the invention when read in conjunction with the drawing figures, in which:

FIG. 3—2-Linearity plot of written dimensions vs imaged dimension of ZEP 7000 developed in 75/25 by volume of DEK/DEM.

DETAILED DESCRIPTION

Figure 1:
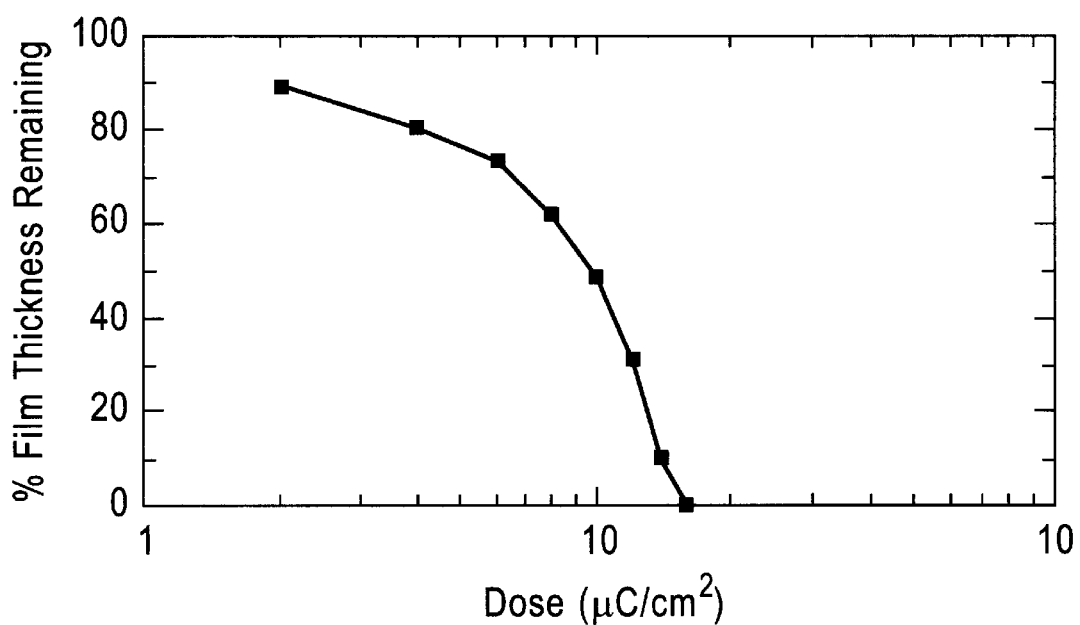
FIG. 1—Contrast curve of ZEP 7000 exposed with 25 KeV electron beams and developed in diethyl ketone/diethyl malonate-(DEK/DEM,) 50/50 by volume.

A typical developer for ZEP utilizes diethyl ketone (3 pentanone) or methyl ethyl ketone (2 butanone). The contrast which results from the 50/50 by volume DEK/DEM (Diethyl Ketone/Diethyl Malonate) is shown in FIG. 1. Greater than 30% of the background film would be lost with the GHOST correction.

TABLE 1

Boiling points and evaporation rates of Potential ZEP developer (solvents and non-solvents)

| Solvent | Non Solvent | Boiling Point Degrees (C.) | Evaporation rate relative to Butyl acetate = 1 |
| --- | --- | --- | --- |
| Methyl ethyl ketone | | 80 | 6.3 |
| 2-Pentanone | | 100 | 2.7 |
| 3-pentanone(diethyl ketone) | | 102 | 2.7 |
| Cyclopentanone | | 135 | 0.6 |
| Anisole | | 154 | 0.2 |
| Diglyme | | 161 | 0.18 |
| | Isoproponal | 82 | 2.8 |
| | Methyl isobutyl ketone | 117 | 1.6 |
| | Propylene glycol methyl ether acetate | 145 | 0.35 |
| | 4-Heptanone | 145 | 0.37 |
| | Diethyl malonate | 199 | 0.05 |

The following examples show improved developers for ZEP:

EXAMPLE 1

Figure 2:
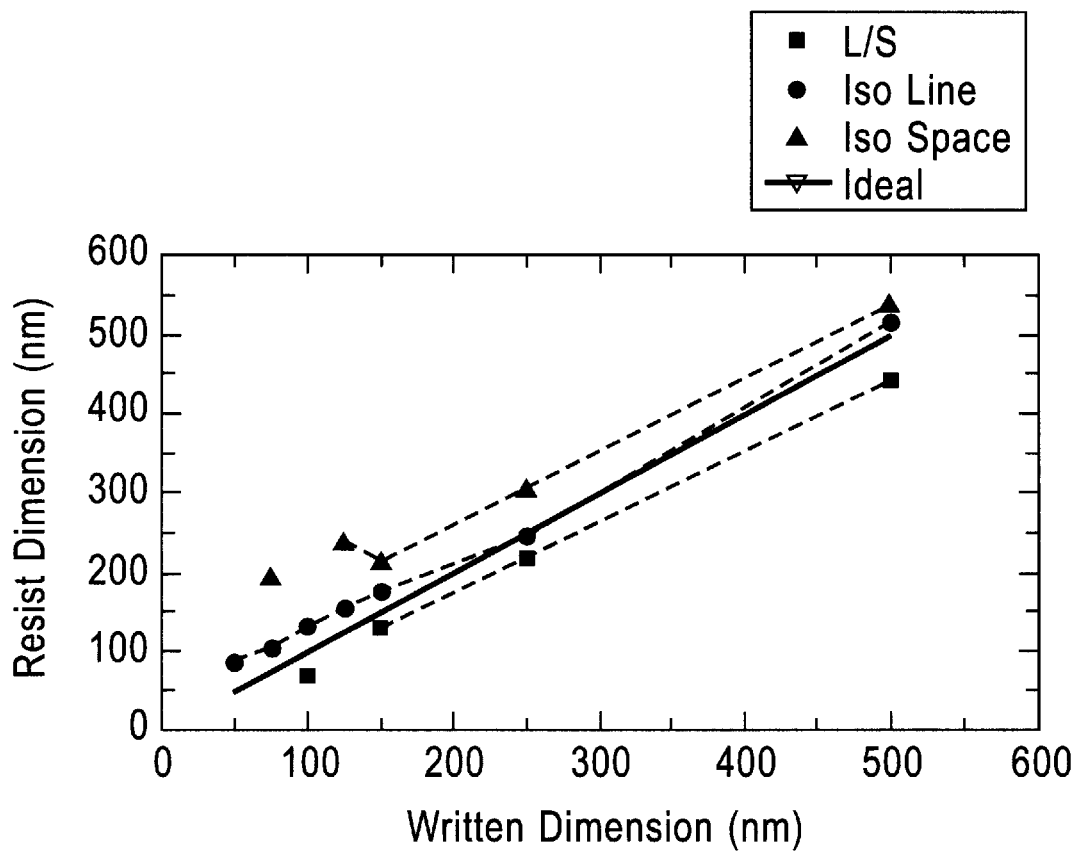
FIG. 2—Linearity plot of written dimensions vs imaged dimension of ZEP 7000 developed in 50/50 by volume of DEK/DEM.
Figure 3:
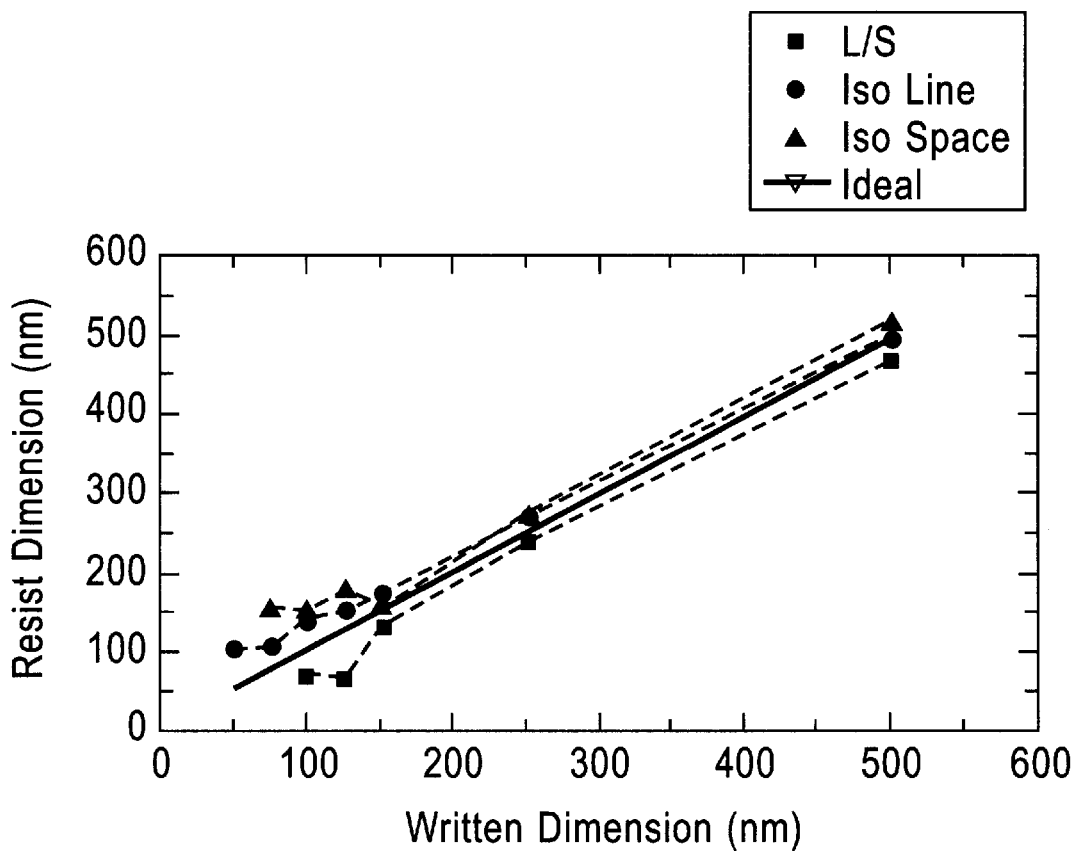

The first improvement comes by changing the ratio of the developer components. Although this does not change the contrast or the thinning, the linearity improves by changing from a 50:50 mixture to a 75:25 mixture of diethyl ketone:diethyl malonate. The linearity curves can be seen in FIGS. 2 and 3 respectively. Improved linearity can be seen in the case of the higher diethyl ketone content.

It was determined that diethyl ketone is the solvent for the polymer, while diethyl malonate is the non-solvent.

EXAMPLE 2

Figure 4:
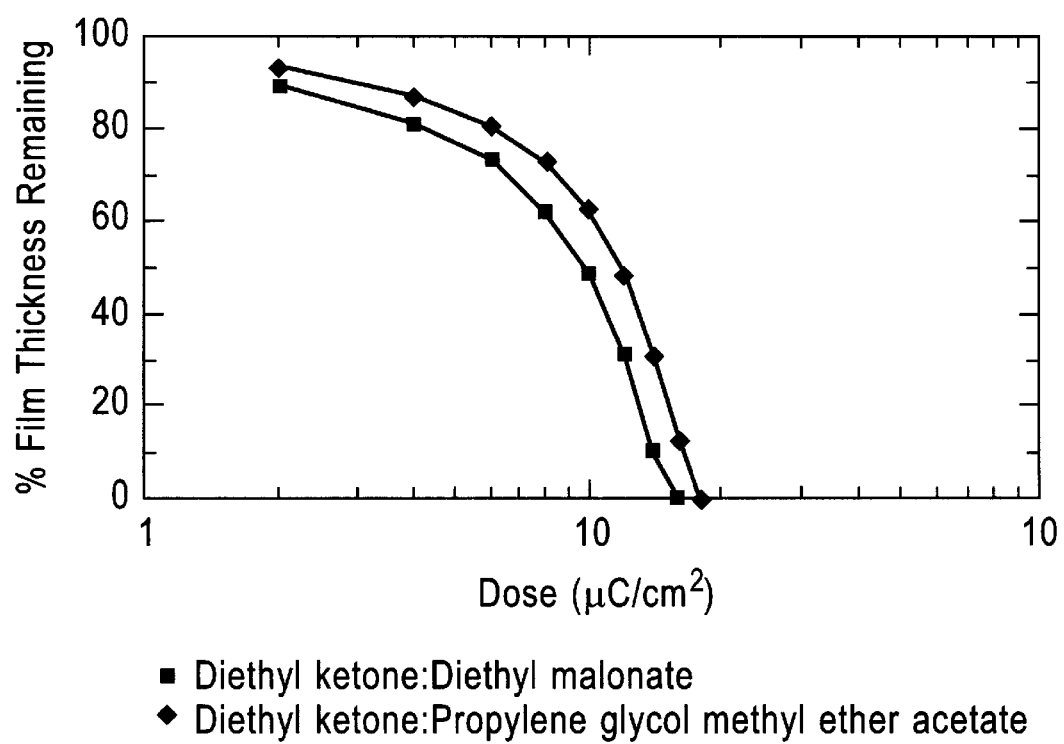
FIG. 4—Comparison of contrast of DEK/DEM and the DEK/propylene glycol methylether acetate (PGMEA) developers.
Figure 5:
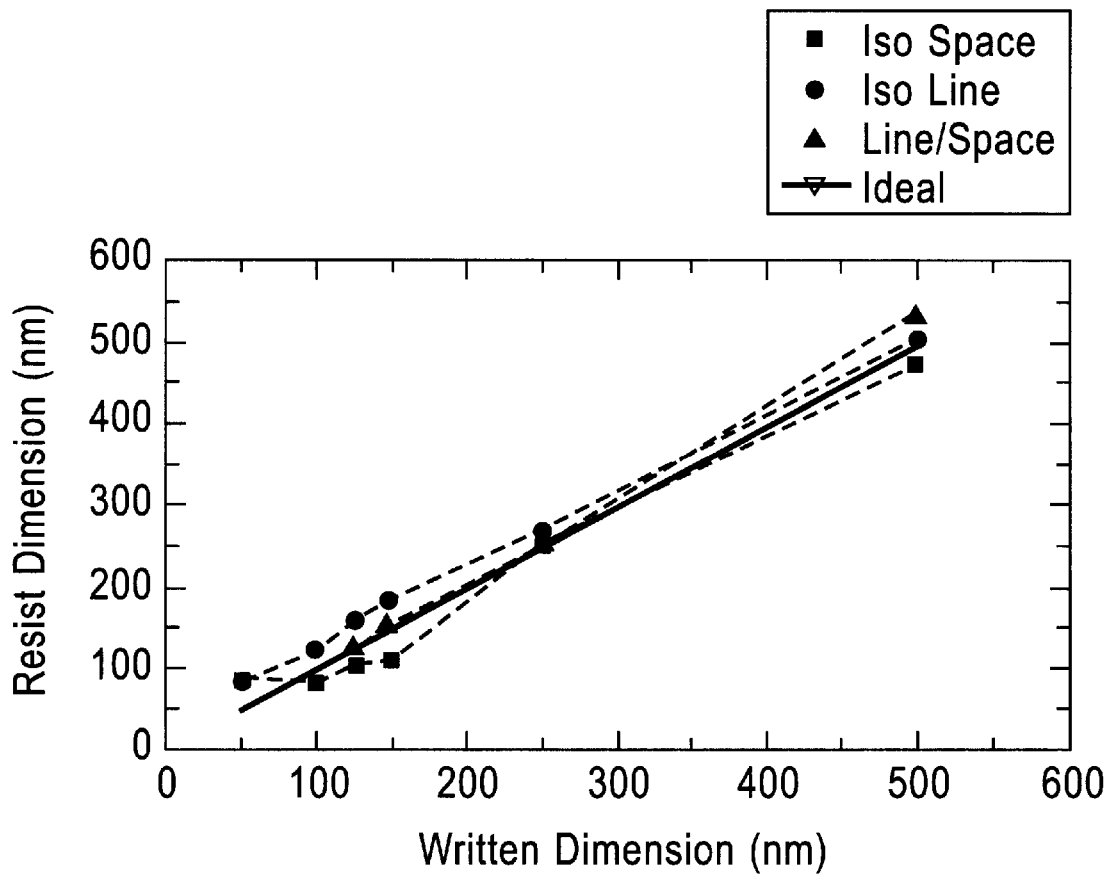
FIG. 5—Linearity plot for the 60//40 DEK/PGMEA developer.

The second example of an improved developer is accomplished by changing the non-solvent from diethyl malonate to propylene glycol methyl ether acetate (PGMEA.) In FIG. 4, the contrast curve for a 60:40 mixture of diethyl ketone:PGMEA is shown compared to a 75:25 mixture of diethyl ketone:diethyl malonate. In addition to raising the contrast from 1.8 to 1.9, the thinning at the GHOST dose decreased from 35% to 22% when using the diethyl ketone:PGMEA mixture.

In addition to the improved contrast and linearity, the diethyl ketone:PGMEA developer has an advantage of a closer match in boiling points (37 degrees C. difference) of the two solvents over the diethyl ketone:diethyl malonate system (91 degrees C. difference). This translates into better CD uniformity. In Table 2 the CD statistics are shown for a reticle spray developed in the diethyl ketone:diethyl malonate system vs tank development in the diethyl ketone:PGMEA developer.

TABLE 2

Comparison of the 3 sigma values for both X and Y linewidths across a 6 inch reticle.

| diethyl ketone:diethyl malonate, 3 sigma for X & Y combined (nm) | diethyl ketone:PGMEA, 3 sigma for X & Y combined (nm) |
| --- | --- |
| 45 | 77 |

EXAMPLE 3

Figure 6:
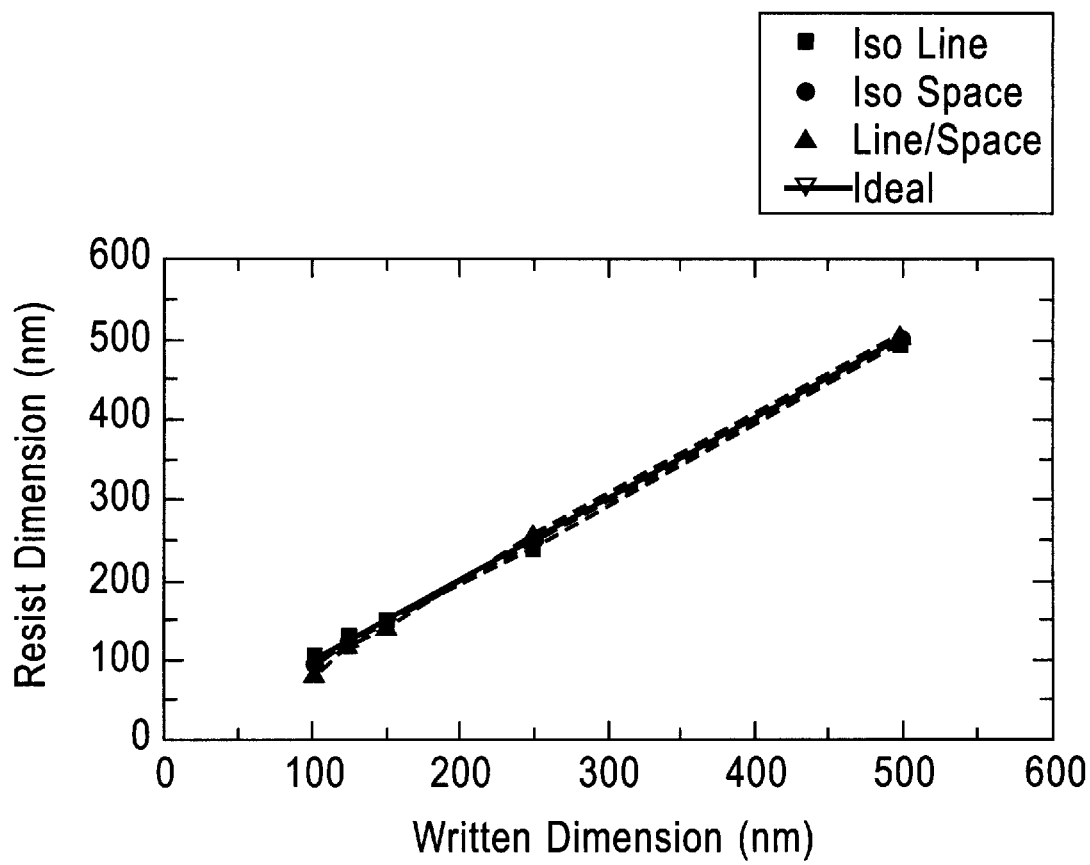
FIG. 6—Linearity plot for the 24% by volume of developer of anisole and 4-heptanone.
Figure 7:
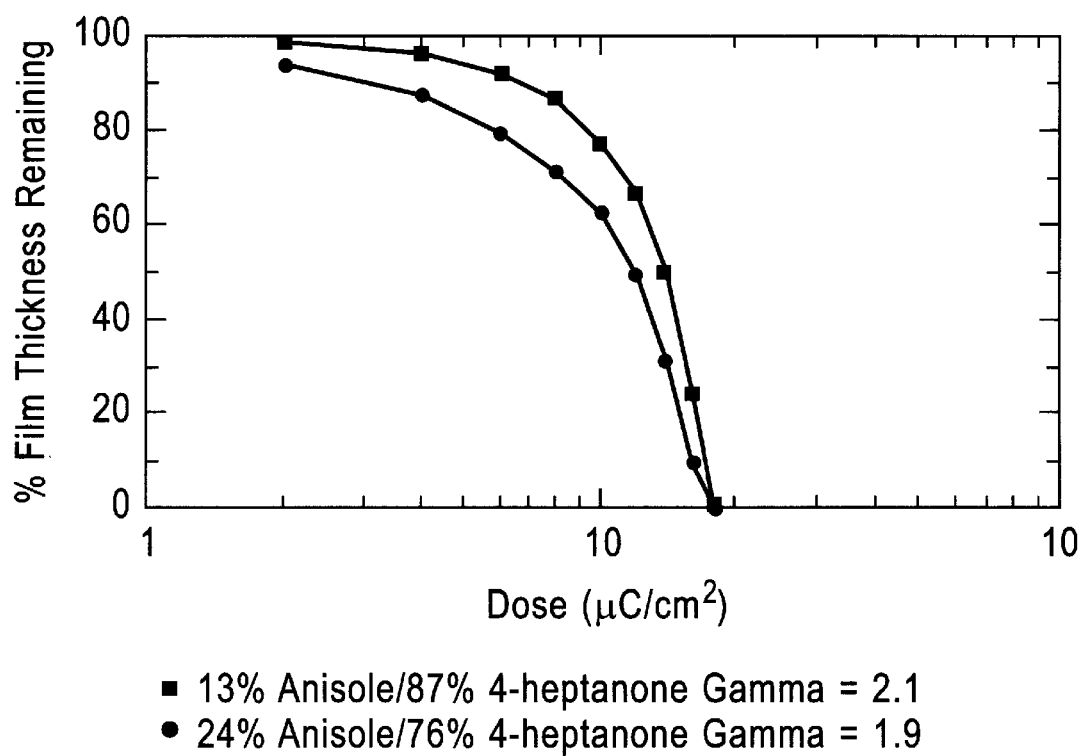
FIG. 7—Contrast curves for the anisole/4-heptanone developers.

A third example of an improved developer is a mixture of anisole and 4-heptanone. With this developer contrast can be improved to 2.1 using a 13% anisole solution, contrast is 1.9 using a 24% anisole solution. Thinning at the 40% GHOST dose is 11% and 23% respectively. Contrast curves can be seen below in FIG. 6. Linearity for the 24% anisole system is shown in FIG. 7, and is an improvement over the other developers. The boiling points difference between these 2 solvents is 9 degrees C. Therefore, an improvement in CD uniformity is expected.

Table 3 below summarizes the 3 sigma values from reticles printed at varying doses and spray developed in the diethyl ketone:diethyl malonate developer vs the 24% anisole:4-heptanone developer. In all cases there is an improvement in uniformity with the 24% anisole:4-heptanone system.

TABLE 3

Comparison of 3 sigma values for the diethyl ketone:diethyl malonate developer vs the 24% anisole:4-heptanone developer at varying doses.

| Developer | 3 sigma (nm) at 8 uC/cm2 | 3 sigma (nm) at 9 uC/cm2 | 3 sigma (nm) at 10 uC/cm2 | 3 sigma (nm) at 11 uC/cm2 | 3 sigma (nm) at 12 uC/cm2 |
|---|---|---|---|---|---|
| Diethyl ketone:Diethyl malonate | 84 | 50 | 31 | 31 | 27 |
| Anisole:4-hept. | 56 | 34 | 28 | 20 | 19 |

While this invention has been described in terms of certain embodiment thereof, it is not intended that it be limited to the above description, but rather only to the extent set forth in the following claims. The embodiments of the invention in which an exclusive property or privilege is claimed are defined in the appended claims. The teaching of all references cited herein, are incorporated herein by reference.

What is claimed is:

1. A composition for developing exposed resists comprising a solvent and a non-solvent in a mixture ranging from 10–90 wt % solvent, said solvent and said non-solvent having boiling points between 100–170C.

2. A composition according to claim 1 where said solvents are selected from the group consisting of alkyl ketones of structure $R_1(CH_2)_nCO(CH_2)_nR_2$ and aryl ethers of structure $ArO(CH_2)_mCH_3$ wherein $R_1$ and $R_2$ are alkyl groups and $n \geq 1$ and $m \geq 0$.

3. A composition according to claim 1 where said non-solvents are selected from the group consisting of alkyl esters and alkyl ketones.

4. A composition according to claim 2 wherein n=1 or 2.

5. A composition according to claim 2 where m is 0 or 1.

6. A composition according to claim 1 wherein said resist comprises a copolymer of alpha-chloro methacrylate and alpha-methyl styrene of which the chloromethacrylate mole % ranges from 35–65%.

7. A composition according to claim 1 wherein said composition is a 75:25 mixture by weight percent mixture of diethyl ketone:diethyl malonate.

8. A composition according to claim 1 wherein said composition is a 60:40 mixture by weight percent a mixture of diethyl ketone:propylene glycol methyl ether acetate.

9. A composition according to claim 1 wherein said composition mixture is a 60:40 mixture by weight percent of diethyl ketone:propylene glycol methyl ether acetate.

10. A composition according to claim 1 wherein said resist is a mixture of anisole and 4-heptanone.

11. A composition according to claim 10 wherein said anisole is present in an amount from about 13% to about 24% by wt.

12. A method of use of the developer compositions of claims 1–4 or 5 comprising spraying said developer compositions followed by rinse in a non-solvent.

13. A method according to claim 7 wherein said non-solvent is methyl isobutyl ketone.

14. A composition according to claim 12 wherein said composition is a 75:25 mixture by weight percent mixture of diethyl ketone:diethyl malonate.

15. A composition according to claim 1 wherein said resist is a positive resist.

16. A composition according to claim 1 wherein said resist is a negative resist.

17. A method for developing exposed resists with a composition comprising a solvent and non-solvent in a mixture ranging from 10–90 wt % solvent, said solvent and said non-solvent having boiling points between 100–170 C.

18. A method according to claim 17 where said solvents are selected from the group consisting of alkyl ketones of structure $R_1(CH_2)_nCO(CH_2)_nR_2$ and aryl ethers of structure $ArO(CH_2)_mCH_3$ wherein $R_1$ and $R_2$ are alkyl groups and $n \geq 1$ and $m \geq 0$.

19. A method according to claim 17 where said non-solvents are selected from the group consisting of alkyl esters and alkyl ketones.

20. A method according to claim 18 wherein n=1 or 2.

21. A method according to claim 18 where m is 0 or 1.

22. A method according to claim 17 wherein said resist comprises a copolymer of alpha-chloro methacrylate and alpha-methyl styrene of which the chloromethacrylate mole % ranges from 35–65%.

23. A method according to claim 17 further including spraying said developer compositions followed by rinse in a non-solvent.

24. A method according to claim 23 wherein said non-solvent is methyl isobutyl ketone.

25. A method according to claim 17 wherein said developer is a 75:25 mixture by weight percent of diethyl ketone:diethyl malonate.

26. A method according to claim 23 wherein said developer is a 75:25 mixture by weight percent mixture of diethyl ketone:diethyl malonate.

27. A method according to claim 17 wherein said developer is a 60:40 mixture by weight percent a mixture of diethyl ketone:propylene glycol methyl ether acetate.

28. A method according to claim 17 wherein said developer is a 60:40 mixture by weight percent of diethyl ketone:propylene glycol methyl ether acetate.

29. A developer according to claim 17 wherein said resist is a mixture of anisole and 4-heptanone.

30. A developer according to claim 29 wherein said anisole is present in an amount from about 13% to about 24% by wt.

31. A method according to claim 17 wherein said resist is a positive resist.

32. A method according to claim 23 wherein said resist is a negative resist.

* * * * *